(12) United States Patent
Carey et al.

(10) Patent No.: US 7,190,290 B2
(45) Date of Patent: Mar. 13, 2007

(54) METHOD AND APPARATUS FOR ADDRESSING RECEIVE BAND NOISE PROBLEMS ASSOCIATED WITH THE USE OF A DIGITAL POWER AMPLIFIER

(75) Inventors: Eoin Carey, Cork (IE); Bernie Mullins, Cork (IE)

(73) Assignee: M/A-Com, Eurotec B.V., Cork (IE)

( * ) Notice: Subject to any disclaimer, the term of this patent is extended or adjusted under 35 U.S.C. 154(b) by 0 days.

(21) Appl. No.: 10/925,191

(22) Filed: Aug. 24, 2004

(65) Prior Publication Data
US 2006/0055573 A1 Mar. 16, 2006

(51) Int. Cl.
*H03M 1/06* (2006.01)
(52) U.S. Cl. ..................................... 341/118
(58) Field of Classification Search ............... 341/159, 341/143, 141, 126, 155, 156, 144, 118; 330/285, 330/296, 51, 288, 302, 315, 316
See application file for complete search history.

(56) References Cited

U.S. PATENT DOCUMENTS

| | | |
|---|---|---|
| 5,442,322 A | 8/1995 | Kornfeld et al. ............ 330/285 |
| 5,742,201 A | 4/1998 | Eisenberg et al. ............ 330/2 |
| 5,973,556 A | 10/1999 | Su ............... 330/10 |
| 6,043,707 A | 3/2000 | Budnik ........................ 330/10 |
| 6,353,359 B1 | 3/2002 | Leizerovich ................... 330/2 |
| 6,563,385 B2 * | 5/2003 | Wojslaw ..................... 330/296 |
| 6,701,134 B1 | 3/2004 | Epperson |
| 6,798,288 B1 * | 9/2004 | Jayaraman et al. ..... 330/207 A |
| 6,825,719 B1 * | 11/2004 | Barak et al. ................. 330/129 |
| 6,873,211 B1 * | 3/2005 | Thompson et al. ......... 330/285 |
| 7,023,272 B2 * | 4/2006 | Hung et al. ................. 330/126 |
| 2002/0090921 A1 | 7/2002 | Midtgaard et al. .......... 455/126 |
| 2002/0196864 A1 | 12/2002 | Booth et al. ................. 375/296 |
| 2004/0021517 A1 | 2/2004 | Irvine et al. ................. 330/151 |
| 2005/0064830 A1 | 3/2005 | Grigore ................... 455/127.4 |
| 2005/0118965 A1 | 6/2005 | Tanabe et al. ............ 455/127.1 |

FOREIGN PATENT DOCUMENTS

| | | |
|---|---|---|
| JP | WO 97/24800 | 7/1997 |
| JP | WO 2004/036737 | 4/2004 |
| WO | WO 02/49300 | 6/2002 |

* cited by examiner

*Primary Examiner*—Brian Young

(57) ABSTRACT

An apparatus and method for biasing at least one transistor of a Radio Frequency Digital to Analog Converter (RF-DAC). The apparatus including a direct base current injection circuit for injecting a DC current waveform directly into a base terminal of the transistor.

10 Claims, 3 Drawing Sheets

METHOD AND APPARATUS FOR ADDRESSING RECEIVE BAND NOISE PROBLEMS ASSOCIATED WITH THE USE OF A DIGITAL POWER AMPLIFIER

FIELD OF THE INVENTION

This present invention relates to digital polar modulation systems, and in particular, to a digital polar modulation system utilizing a power amplifier circuit operating as a Digital to Analog Converter (DAC).

BACKGROUND OF THE INVENTION

Polar Modulation (PM) is a means of processing data so that it may be efficiently and effectively transmitted (by, for example, a Polar Transmitter). PM has several advantages over other available techniques in terms of achievable efficiency. PM makes possible the application of an amplitude modulation data signal at the very last stage of the Polar Transmitter, making it possible to reduce the current drain quickly as the transmit power level is reduced. In the context of handsets, for example, this has clear talk-time benefits.

In a Polar Transmitter, the data to be transmitted is separated into amplitude (a) and phase (p) signals. After separation, the phase signal (p) is applied to a phase modulator, and the amplitude signal (a) is applied to an Amplitude Modulator (AM). A digital PM, as opposed to an analog PM, has the advantage of a handling a high degree of digital content.

One example of a digital Amplitude Modulator (AM) which is utilized in a Polar Modulation scheme is a Radio Frequency Digital to Analog Converter (RFDAC). As described below, an RFDAC may be used to modulate an input in-phase/quad-phase (IQ) base band signal. Before the IQ base band signal is applied to the RFDAC, it is first divided into phase ($a^p$) and amplitude ($a^m$) components. The amplitude component ($a^m$) is subsequently quantized, and applied to the RFDAC, whose RF input is separately modulated by the phase component ($a^p$). However, the RFDAC has certain output receive band noise requirements. Quantization noise from the amplitude component (a) is a potential source of noise which must be addressed.

FIG. 1 shows a polar transmitter 100 including an RFDAC circuit 110, and digital signal processor circuit 120. The RFDAC circuit 110 is controlled by a digital amplitude signal ($a^m$), and driven by a phase modulated RF carrier signal ($a^p$) generated by the digital signal processor circuit 120. Particularly, an input IQ base band signal (a) is first applied to a digital signal processor 10 which converts the analog IQ base band signal to digital (through Analog to Digital Converter (ADC) 11), and also transforms the signal into amplitude ($a^m$) and phase ($a^p$) components (through Rectangular to Polar Converter (RPC) 12). In particular, the ADC 11 digitizes the input analog signal (a), and the RPC 12 translates the digitized wave into polar coordinates. RPC 12 outputs a digitized wave in polar coordinates, which takes the form R, P(sin) and P (cos), for example. In this example, the R coordinate represents an amplitude characteristic ($a^m$) of the digitized input wave. The P(sin) and P(cos) coordinates represent a phase characteristic ($a^p$) of the digitized input wave.

The amplitude ($a^m$) and phase ($a^p$) characteristics are then transmitted through separate paths in the RFDAC circuit 110. The amplitude characteristic ($a^m$) of the digitized input wave is modulated, via modulator 13, into digital pulses comprising a digital word (DW) quantized into, for example, bits $B_0$ to $B_N$, with a Most Significant Bit ("MSB") to Least Significant Bit ("LSB"). The DW may be of varying lengths in various embodiments. In general, the longer the DW the greater the accuracy of reproduction of the input analog wave (a).

In the exemplary embodiment shown in FIG. 1, the digital amplitude signal ($a^m$) is converted into a N-bit (e.g., 7-bit) digital word by signal processor 13. Each bit of the N-bit digital word corresponds to a separate component control line $a_{m1\text{-}N}$ (e.g., $a_{m1\text{-}7}$) at the output of the signal processor 13. Each of the component control lines $a_{m1\text{-}N}$ are coupled to a separate control component 22 (e.g., switching transistors $22_{a\text{-}g}$) which feeds into another transistor 25 (e.g., $25_{a\text{-}g}$), which is turned ON or OFF depending on the particular bit value on the control component line. For example, if the DW corresponding to the digital amplitude signal ($a^m$) is "1110000", the first three (3) transistors (e.g., $25_{a\text{-}c}$) will be biased ON, and the last four (4) transistors (e.g., $25_{d\text{-}g}$) will be biased OFF. In this manner, the amplification of the input analog signal (a) may be effectively controlled, as explained below.

The digital phase signal ($a^p$) is modulated onto a wave by way of Digital to Analog Converter (DAC) 18 and synthesizer 20. The synthesizer 20 preferably comprises a Voltage-Controlled Oscillator (VCO) in the exemplary embodiment. The synthesizer 20 provides an output wave, which includes the phase information from the input wave (a). This output wave has a constant envelope (i.e., it has no amplitude variations, yet it has phase characteristics of the original input wave). The output wave may be further amplified by amplifier 24 before being provided to the plurality of transistors $25_{a\text{-}g}$ on respective phase signal lines $a_{p1\text{-}7}$.

Regulation of the transistors $25_{a\text{-}g}$ may be accomplished by providing the digital word (DW) to the control components (e.g., switching transistors $22_{a\text{-}g}$). Each of the control components $22_{a\text{-}g}$ preferably comprises a transistor acting as a current source. The control components $22_{a\text{-}g}$ are switched by bits of the DW generated from the digital amplitude signal ($a^m$). For example, if a bit (e.g., the bit on line $a_{m1}$) of the DW is a logic "1" (e.g., HIGH), the corresponding control component (e.g., $22_a$) is switched ON, and so current flows from that control component to respective transistor segment (e.g., $25_a$). Similarly, if the same bit (e.g., the bit on line $a_{m1}$) of the DW is a logic "0" (e.g., LOW), the corresponding control component (e.g., $22_a$) is switched OFF, and so current is prevented from flowing through that control component to respective transistor segment (e.g., $25_a$). The current from all transistor segments $25_{a\text{-}g}$ is then combined at the respective transistor outputs $26_{a\text{-}g}$, and provided as an output signal (b) on output signal line 27. Thus, by controlling the value of the DW, the amplification of the digital phase signal ($a^p$) may be accurately controlled using the digital amplitude signal ($a^m$), thereby allowing reproduction of an amplified version of the input analog signal (a) at the output of the RFDAC circuit 110.

The conventional approach to improving receive band noise performance in the RFDAC is to introduce a radiofrequency (RF) filter, with suitable rejection in the receive frequency band, at the polar transmitter output (i.e., at a position downstream from the RFDAC). Inevitably, such a filter will have significant insertion loss in the transmit band, and hence, in order to maintain the desired overall transmit power level at the antenna, the power delivered from the power amplifier (e.g., RFDAC) to the RF filter must be increased accordingly. This increase in transmit power level demands an increase in current drain and hence the overall efficiency degrades.

Thus, there is presently a need for a polar transmitter (including an RFDAC) which has good receive band noise performance along with increased efficiency.

SUMMARY OF THE INVENTION

An exemplary embodiment of the present invention comprises a circuit including at least one first transistor, wherein a base terminal of the transistor is coupled to a signal line for transmitting a radiofrequency waveform to the base terminal, and a direct base current injection circuit for injecting a DC current waveform directly into the base terminal of said transistor.

An exemplary embodiment of the present invention also comprises a method for biasing at least one transistor, including applying a radiofrequency signal at a base terminal of the at least one transistor, injecting a DC current waveform directly into the base terminal of the at least one transistor.

An exemplary embodiment of the present invention also comprises a circuit including a digital processing circuit coupled to an input terminal for converting an analog signal into at least two digital signals, at least one of said digital signals comprising an amplitude signal, and at least one of said digital signals comprising a phase signal, a converter for converting the at least one amplitude signal into a N-bit digital word, and a digital to analog circuit for applying the N-bit digital word to the phase signal, said digital to analog circuit comprising at least one transistor, wherein a DC current waveform is directly injected into a base terminal of the at least one transistor.

DETAILED DESCRIPTION

The present invention comprises, in one exemplary embodiment, an apparatus for interfacing base band filtering with a Radio Frequency Digital to Analog Converter (RFDAC) for achieving optimal receive band noise suppression. Base band filtering of the amplitude signal on component signal lines of the RFDAC ($a_{m1-7}$) prior to their application to the transistor segments (e.g., transistors $25_{a-g}$ shown in FIG. 1) of the RFDAC eliminates the requirement for an RF filter at the output of the RFDAC. Such base band filters can be realized at low cost, and with low associated current drain.

Direct Base Current Injection (DBCI) of the filtered base band control signals applied to the transistors (e.g., transistors $25_{a-g}$) of the RFDAC is proposed. In order that the benefits of the base band filtering are realized at the receive band frequency offsets in the RF domain, the base band to RF transfer characteristic of the transistor segments (e.g., $a_{m1-7}$) must be as linear as possible. A linear transfer characteristic ensures that the base band filtering maps well to the RF domain.

Figure 1:
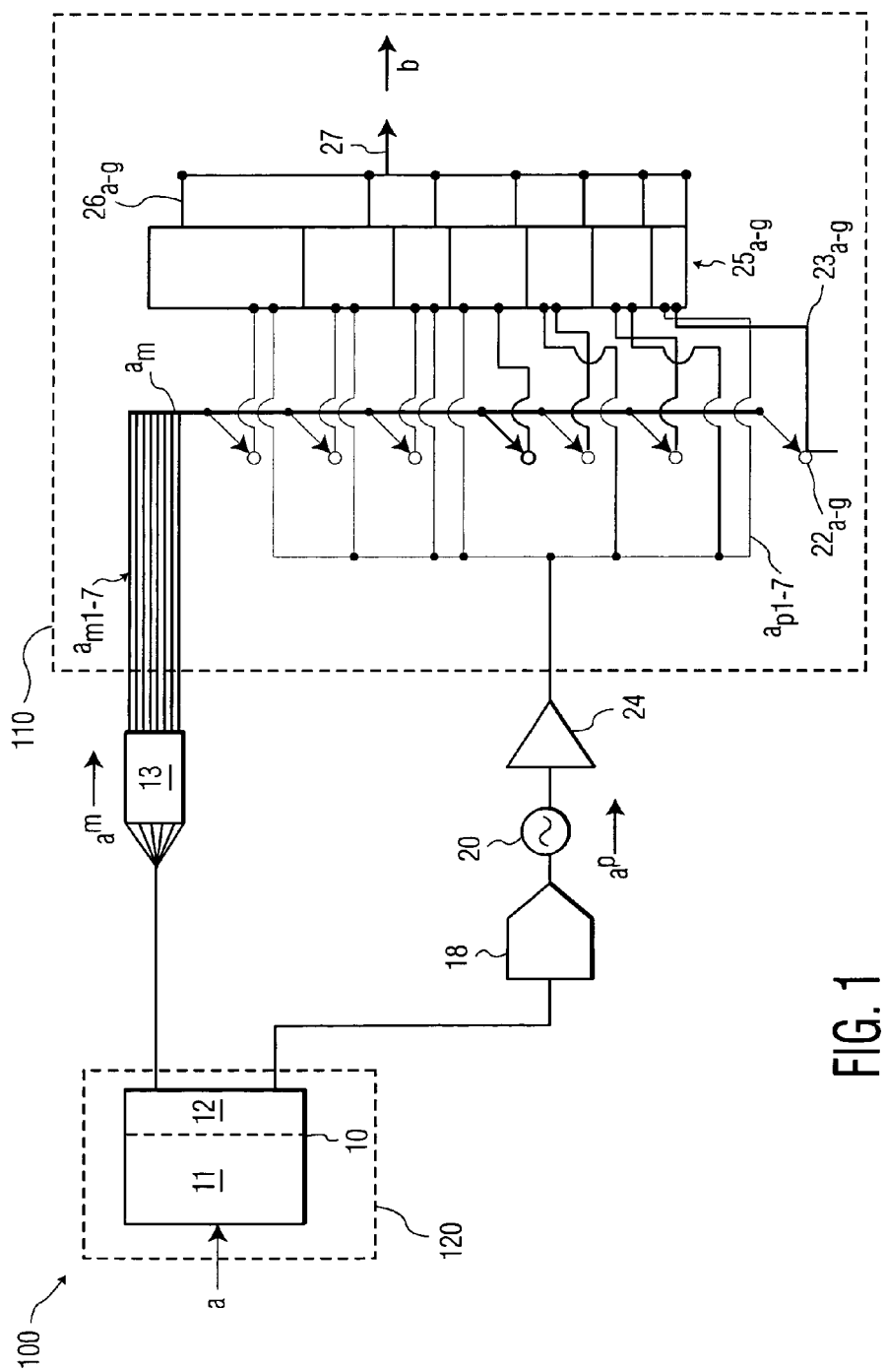
FIG. 1 shows a conventional polar transmitter including an RFDAC circuit.
Figure 2A:
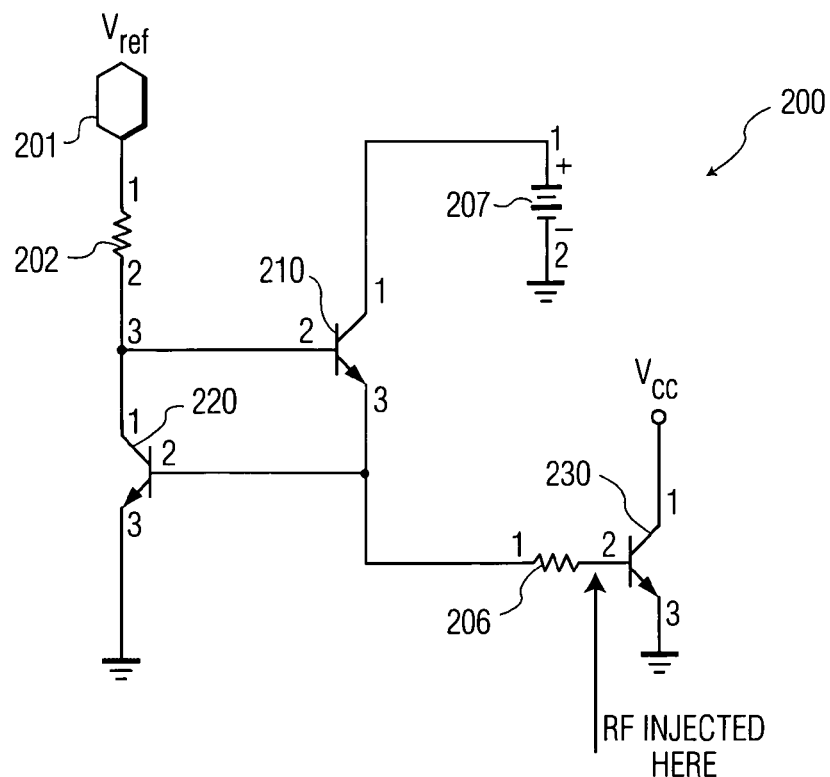
FIG. 2(a) shows a conventional bias circuit.
Figure 3:
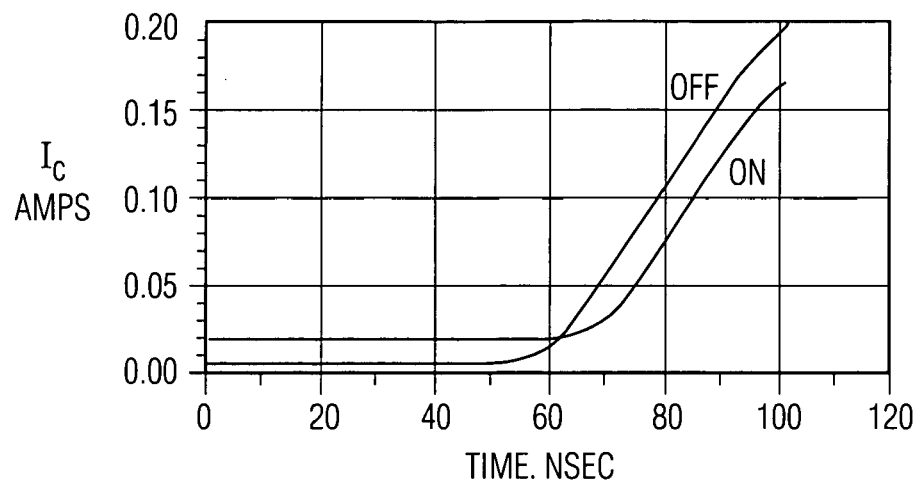
FIG. 3 shows a graph of transistor collector current over time for the bias circuit shown in FIG. 2(a).
Figure 4:
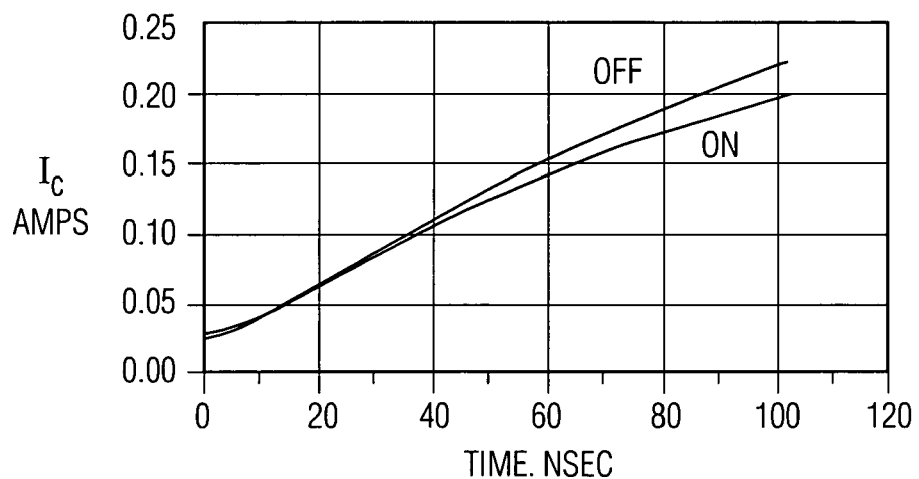
FIG. 4 shows a graph of transistor collector current over time for the bias circuit shown in FIG. 2(b).

For purposes of comparison, FIG. 2(a) shows a conventional bias circuit 200 which may be used to control the operating bias point of the individual transistor segments of an RFDAC (e.g., transistors $25_{a-g}$ shown in FIG. 1). If the filtered base band waveforms are applied to the bases of the transistor segments (e.g., $25_{a-g}$) of the RFDAC via such a bias circuit, where a reference voltage signal $V_{ref}$ is applied to a reference voltage terminal 201 of the bias circuit 200, the linearity of the base band to RF transfer characteristics are constrained as shown in FIG. 3 (i.e., the response curves do not become linear until approximately sixty (60) nanoseconds (ns) have passed, which is the approximate time it takes an applied reference voltage ramp ($V_{ref}$) to reach a threshold of approximately $2*V_{be}$ and thus induce a current in transistor 230, where $V_{be}$ is the base-emitter voltage of the transistor 230). To overcome this, an offset is required in $V_{ref}$ to ensure that the transistor (e.g., transistor 230) responds sooner. The optimum amount of offset varies depending on the instantaneous operating conditions of the RFDAC. However, where a reference current ramp is applied directly to the base of a transistor (e.g., transistor 230), the base band to RF transfer characteristics are more linear, as shown in FIG. 4.

The bias circuit 200 includes a first transistor 210 with its base, coupled to a reference voltage terminal $V_{ref}$, a second transistor 220 with its collector terminal also coupled to $V_{ref}$, and a third transistor 230 with its base connected to an input radio frequency signal. In this schematic, the third transistor 230 represents each transistor segment (e.g., transistors $25_{a-g}$) of the RFDAC (i.e., the bias circuit 200 will provide a biasing signal to each of the transistors $25_{a-g}$ of the RFDAC dependent on the input level of $V_{ref}$).

The bias circuit 200 also includes a first input resistor 202 coupled between the reference voltage terminal 201 and the first and second transistors 210, 220. A voltage source 207 is coupled to the collector of the first transistor 210 for providing the base currents for the second and third transistors 220, 230. An input resistor 206 is coupled to the base of the third transistor 230 to limit the current applied to the base, and hence enhance the thermal stability of the design.

In a conventional bias scheme, a voltage ($V_{ref}$) is applied at the reference voltage terminal 201 which initiates a reference current $I_{ref}$ in the collector of second transistor 220. Particularly, $I_{ref}$ will equal $V_{ref}$ less the base-emitter voltage drops ($V_{be210}$, $V_{be220}$) associated with the first and second transistors 210 and 220, divided by the value of the input resistor 202. The bias circuit 200 acts in such a way that the reference current $I_{ref}$ is mirrored at the collector of the third transistor 230. This mirrored collector current IC will be approximately equal to $K*I_{ref}$, where K is a scaling factor defined as the geometric ratio of the area of the third transistor 230, to the area of the second transistor 220. The first transistor 210 is typically referred to as a 'Beta helper' device, and is included in the bias circuit 200 to make the mirrored collector current Ic=$K*I_{ref}$ approximation more accurate.

FIG. 3 is a graph showing the time domain response of transistor collector current ($I_c$) in Amps (A) in response to a linear base band voltage ramp signal ($V_{ref}$) applied at the reference voltage terminal 201 of the bias circuit 200. FIG. 3 represents the base band to RF characteristic associated with the bias circuit 200 using a conventional biasing scheme.

FIG. 3 shows simulated RF collector current response curves "OFF" and "ON" when a linear voltage ramp signal ($V_{ref}$) is applied at the reference voltage terminal 201 of the above-described bias circuit 200. The response curves represent the RF component of the collector current ($I_c$) of the third transistor 230 in response to the voltage ramp ($V_{ref}$) signal at the reference voltage terminal 201. The two response curves shown in FIG. 3 (e.g., "OFF" and "ON") correspond to different loading conditions associated with the other transistor segments of the RFDAC.

For the example shown in FIG. 3, the OFF curve corresponds to the base band to RF characteristic when only one transistor segment (e.g., $25_a$ in FIG. 1) is being ramped from OFF to ON (i.e., a digital word "0000000" to "0000100"), with all other segments (e.g., $25_{b-g}$) being OFF throughout. The ON curve corresponds to the base band to RF characteristic when only one transistor segment (e.g., $25_a$ in FIG. 1) is being ramped from OFF to ON (i.e., a digital word "1111011" to "1111111"), with all other segments (e.g., $25_{b-g}$) being ON throughout.

As shown in FIG. 3, the RF collector current in the third transistor 230 does not respond until such a time as when the applied voltage ($V_{ref}$) at the reference voltage terminal 201 is sufficient to turn ON all three transistors 210–230 of the bias circuit 200. This condition is achieved when the applied reference voltage ($V_{ref}$) at the reference voltage terminal 201 reaches $2*V_{be}$, where $V_{be}$ is the turn-on base-emitter voltage for the particular transistors (e.g., transistors 210–230) used.

When operating the bias circuit 200 as described above (i.e., using a reference voltage $V_{ref}$), the expected RF collector current response becomes sensitive to variations in the loading effects from other transistors (segments) of the RFDAC. In particular, the precise base band voltage where the collector current starts to respond varies depending on the biasing condition of other transistors (segments). This means that the base band to RF transfer characteristic of a given transistor (segment) is a function of the state of the other transistors of the RFDAC. This, in turn, means that base band to RF transfer characteristic varies with time under modulation. The impact of this is that the realization of ideal receive band noise suppression is not possible when operating the bias circuit 200 in this manner.

Rather than utilizing a reference voltage $V_{ref}$ applied to a reference voltage terminal 201 of the bias circuit 200 to generate a collector current $I_c$ in the third transistor 230, a current may be directly injected into the base of the third transistor 230. The present inventors refer to this method of biasing herein as Direct Base Current Injection (DBCI).

Figure 2B:
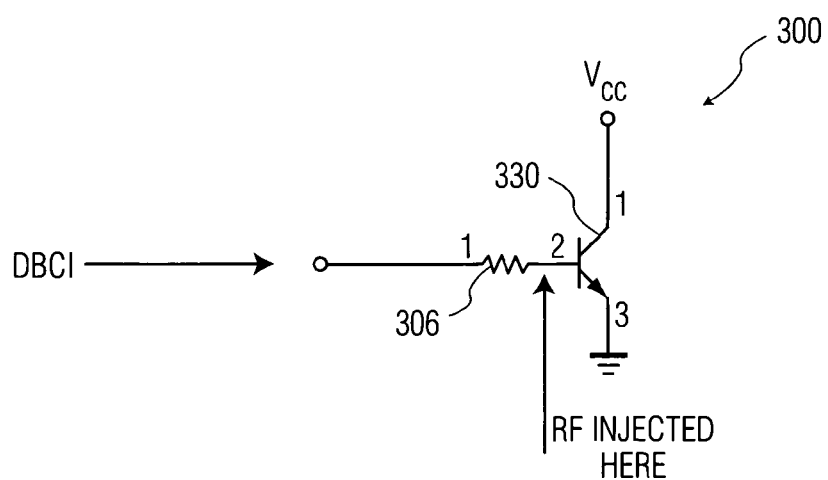
FIG. 2(b) shows a bias circuit according to an exemplary embodiment of the present invention.

FIG. 2(b) shows a bias circuit 300 using DBCI. The bias circuit 300 includes only an input resistor 306, through which a bias current is injected (as opposed to being generated from an applied reference voltage $V_{ref}$) into a transistor base terminal. The input resistor 306 is coupled to the base of a transistor 330 (similar to input resistor 206 in the bias circuit 200 described above), to enhance the thermal stability of the design. As with the conventional bias circuit 200 described above, the transistor 330 represents each transistor segment (e.g., transistors $25_{a-g}$) of the RFDAC. The injected current may be generated by a current source (not shown), or other equivalent current generating means.

FIG. 4 shows a time-domain response of transistor collector current ($I_c$) in Amps (A) in response to a linear base band current ramp signal applied directly at the base of the transistor 330 of the bias circuit 300 (rather than applying a reference voltage $V_{ref}$ at the reference voltage terminal 201 in the bias circuit 200 to initiate the collector current $I_c$ in the third transistor 230). This represents the base band to RF characteristic associated with biasing the transistor 330 via Direct Base Current Injection (DBCI).

Applying this principle to the RFDAC circuit 110 shown in FIG. 1, a more optimal method to apply the filtered amplitude ($a^m$) data waveforms (e.g., the signals on component lines $a_{m1-7}$ in FIG. 1) to the transistor segments (e.g., transistors $25_{a-g}$ in FIG. 1) of the RFDAC is to deliver these waveforms in current mode directly into the bases of the individual transistors (segments) (e.g., transistors $25_{a-g}$), rather than using a conventional reference voltage ($V_{ref}$) biasing, as described above with reference to FIG. 3.

Given that it is the output RF collector current (e.g., $I_c$) of the transistor segments (e.g., transistors $25_{a-g}$ in FIG. 1) that requires filtering, a good way to control this waveform accurately is by means of the base currents of the same transistor devices (e.g., transistors $25_{a-g}$). Conceptually, by applying a filtered version of the digital amplitude base band current waveform into the base of a segment transistor (e.g., one of transistors $25_{a-g}$), the DC collector waveform should track the applied filtered base band waveform in line with the DC Beta parameter of the particular transistor segment. DC Beta may be defined as $I_c/I_b$, where $I_c$ is the DC collector current of the particular transistor and $I_b$ is the DC base current applied to the transistor.

Under RF drive, the relationship between the DC and RF components of the collector current for each transistor (segment) is a complex function. However this relationship between DC and RF components is close to linear for the operating conditions of interest. Accordingly, by filtering the base current (e.g., $I_b$) flowing into the base of each of the RFDAC transistors segments (e.g., transistors $25_{a-g}$ in FIG. 1; transistor 330 in FIG. 2(b)), the associated RF collector current waveform (e.g., $I_c$) is effectively filtered in a similar manner.

FIG. 4 shows the simulated RF collector current response curves where a linear base current ramp signal is injected directly into the base of one or more of the transistor segments (e.g., $25_{a-g}$) of the RFDAC. Again as discussed above, the two curves "OFF" and "ON" indicate the sensitivity of the RF current response to changes in the loading effects due to other segments of the RFDAC being either ON or OFF.

For example, the OFF curve in FIG. 4 corresponds to the base band to RF characteristic when only one transistor segment (e.g., $25_a$ in FIG. 1) is being ramped from OFF to ON (i.e., a digital word "0000000" to "0000100"), with all other segments (e.g., $25_{b-g}$) being OFF throughout. The ON curve in FIG. 4 corresponds to the base band to RF characteristic when only one transistor segment (e.g., $25_a$ in FIG. 1) is being ramped from OFF to ON (i.e., a digital word "1111011" to "1111111"), with all other segments (e.g., $25_{b-g}$) being ON throughout.

It is clear on comparing the responses in FIGS. 3 and 4 that the base band to RF transfer characteristic associated with the DBCI bias circuit 300 (i.e., FIG. 4) is preferable to that associated with the conventional bias circuit 200 using a reference voltage mode approach, for the following reasons:

1. For a given loading condition due to other segments, the DBCI characteristic is more linear; and,
2. The variation between characteristics for different loading effects (i.e., sensitivity to state) is less for DBCI.

There are other, non-performance-related, benefits also associated with the use of DBCI as the control scheme for the RFDAC. For example, the need for bias circuits for the RFDAC transistors (segments) no longer arises, and this leads to an area saving in the die layout. Moreover, the elimination of the bias circuits means that the associated current drain not directly injected into the segment base is eliminated and this leads to a fundamentally more efficient solution overall (in the context of the conventional voltage mode operation).

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A circuit comprising:
   a plurality of segmented transistors, each having a base terminal coupled to a signal line for transmitting a radiofrequency waveform to the base terminal; and
   a direct base current injection circuit for injecting a plurality of DC current waveforms directly into the base terminals of the segmented transistors, wherein each segmented transistor is injected with a corresponding DC current waveform, and
   wherein each of the injected DC current waveforms corresponds to a portion of a digital current base band waveform.

2. The circuit of claim 1, wherein each of the DC current waveforms is filtered so as to provide a substantially linear collector current in each of the segmented transistors.

3. The circuit of claim 1, wherein the injected DC current waveforms each procuce a linear collector current at a collector terminal of a corresponding segmented transistor.

4. A method for biasing a plurality of transistors, comprising the steps of:
   applying a radiofrequency signal at a base terminal of each of the plurality of transistors; and,
   injecting a plurality of DC current waveforms directly into the base terminals of the plurality of transistors, wherein each segmented transistor is injected with a corresponding DC current waveform, and wherein each of the injected DC current waveforms corresponds to a portion of a digital current base band waveform.

5. The method of claim 4, wherein the DC current waveforms are filtered so as to provide a substantially linear collector current in the plurality of transistors.

6. The method of claim 4, comprising the further step of:
   generating a substantially linear collector current at a collector terminal of each of the plurality of transistors.

7. A circuit comprising:
   a digital processing circuit coupled to an input terminal for converting an analog signal into at least two digital signals, at least one of said digital signals comprising an amplitude signal, and at least one of said digital signals comprising a phase signal;
   a signal processor for converting the at least one amplitude signal into a N-bit digital word; and,
   a digital to analog circuit for applying the N-bit digital word to a processed version of the phase signal, said digital to analog circuit comprising at least one transistor, wherein a DC current waveform is directly injected into a base terminal of the at least one transistor.

8. The circuit of claim 7, wherein the injected DC current waveform produces a linear collector current at a collector terminal of the at least one transistor.

9. The circuit of claim 7, wherein the at least one transistor comprises a plurality of transistors, each having a DC current waveform injected at its base terminal.

10. The circuit of claim 7, wherein the DC current waveform is filtered so as to provide a substantially linear collector current in the at least one transistor.

* * * * *